United States Patent
Fifield et al.

(10) Patent No.: US 8,027,207 B2
(45) Date of Patent: Sep. 27, 2011

(54) LEAKAGE COMPENSATED REFERENCE VOLTAGE GENERATION SYSTEM

(75) Inventors: John A. Fifield, Essex Junction, VT (US); Harold Pilo, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 12/639,454

(22) Filed: Dec. 16, 2009

(65) Prior Publication Data

US 2011/0141824 A1 Jun. 16, 2011

(51) Int. Cl.
*G11C 5/14* (2006.01)
(52) U.S. Cl. ............... 365/189.09; 365/96; 365/189.07; 365/225.7
(58) Field of Classification Search ............ 365/189.05, 365/96, 189.07, 225.7
See application file for complete search history.

(56) References Cited

U.S. PATENT DOCUMENTS

| | | | |
|---|---|---|---|
| 4,215,282 A | 7/1980 | Brown et al. | |
| 4,342,102 A | 7/1982 | Puar | |
| 4,661,927 A * | 4/1987 | Graebel | 365/175 |
| 4,969,124 A * | 11/1990 | Luich et al. | 365/201 |
| 5,005,154 A * | 4/1991 | Masuda | 365/96 |
| 6,005,806 A * | 12/1999 | Madurawe et al. | 365/185.23 |
| 6,574,145 B2 * | 6/2003 | Kleveland et al. | 365/185.19 |
| 6,646,912 B2 * | 11/2003 | Hurst et al. | 365/175 |
| 6,697,283 B2 | 2/2004 | Marotta et al. | |
| 7,161,859 B2 | 1/2007 | Sumitani et al. | |
| 7,248,494 B2 | 7/2007 | Oh et al. | |
| 7,342,408 B2 | 3/2008 | Kim | |
| 7,729,188 B2 * | 6/2010 | Aipperspach et al. | 365/205 |

\* cited by examiner

*Primary Examiner* — Hoai V Ho
*Assistant Examiner* — Pablo Huerta
(74) *Attorney, Agent, or Firm* — Scully, Scott, Murphy & Presser, P.C.; David A. Cain, Esq.

(57) ABSTRACT

An e-fuse sense circuit employs a single ended sense scheme in which the reference voltage is compensated for leakage. A reference voltage generator includes a pull-up resistor of similar value to the selected bitline pull-up resistor. As the sensing trip point is adjusted by selection of a bitline pull-up resistor, a pair of pull-up and pull-down resistors are adjusted together to adjust the impedance of the reference voltage generator. A leakage-path simulation structure including a parallel connection of bitcells is added to the reference voltage generator. The leakage-path simulation structure imitates the bitcells on a bitline in the array of e-fuses. Leakage current on the bitline offsets the bitline voltage by a certain error voltage. The reference voltage is also offset by a fraction of the error voltage to balance the shifts in the '1' and '0' margin levels in the presence of leakage.

20 Claims, 6 Drawing Sheets

US 8,027,207 B2

LEAKAGE COMPENSATED REFERENCE VOLTAGE GENERATION SYSTEM

FIELD OF THE INVENTION

The present invention relates to semiconductor circuitry, and particularly to a semiconductor device sense circuit.

BACKGROUND OF THE INVENTION

Electrically programmable fuses may be employed in semiconductor chips for a number of purposes including the storage of unalterable information for permanent memory, selection of a particular configuration from among many possible circuit configurations, optimization of the value of a particular analogue circuit component, optimization of overall circuit performance, and electronic replacement of defective circuit elements with redundant circuit elements. An electrical programmable fuse is also called an electrical fuse or an e-fuse.

Electrical fuses in a semiconductor chip may be programmed on a tester before packaging of the chip in an environment where a stable voltage supply is available, inside an operational computer where the voltage supply is less stable, or in hand held devices where the power source is often a battery with a wide range of voltage variations during the operation. The number of electrical fuses in a semiconductor chip may vary between a few fuses to millions of fuses. In most configurations where multiple fuses are employed, the electrical fuses are in an array format where the voltage supplies are shared among many fuses. The array may be addressable by a scan chain or by a row and column addressing scheme. By selecting a particular electrical fuse and allowing a sufficient amount of electrical current flow through the fuse, the fuse is "programmed." Once the electrical fuse programs, the electrical resistance of the fuse changes and the sense circuit detects the change of the resistance to read the stored information.

An e-fuse array using a single ended sense scheme needs a reference voltage set to a level half way between a '1' and '0' bitline levels respectively, corresponding to programmed fuses and unprogrammed (intact) fuses. An e-fuse array has a plurality of fuse bitcells connected to a common bitline and forms a first input to a sense amplifier. A second input to the sense amplifier is the reference voltage and is ideally at a voltage half way between '1' and '0' bitline levels for equal '1' and '0' sense margin.

One problem with an e-fuse array is that leakage from unselected fuse bitcells lowers the voltage level on the bitline during sensing, and reduces the signal margin for the '1', or programmed fuse state. The level of leakage current is sensitive to the programming pattern of the e-fuse array, and particularly to the fraction of the programmed fuses because programmed fuses effectively shut off a leakage current path, while unprogrammed fuses provide leakage paths. Thus, the sensing circuit with the single ended sense scheme suffers from programming pattern sensitivity in which the number of intact bitcells on a common bitline affects the signal margin for a selected bitcell.

The shift in the output voltage in the sense circuit due to the leakage current through the unprogrammed bitcells is proportional to the level of average leakage current through the bitcells. The level of the average leakage current is hardware-dependent, i.e., affected by the process variations in a manufacturing process. Because the level of the average leakage current has a statistical distribution due to the process variations during manufacturing, the net effect of the leakage current through the bitcells is a decrease in the sense margin of the sense circuit, thereby making an erroneous reading of the state of electrical fuses more likely, i.e., increasing the probability of a sensing error in the sensing circuit.

Such sensing errors are detrimental to the operation of an e-fuse array. In such cases, a stored data of '0' may be read as '1' or vice versa. A sense circuit that provides an enhanced sense margin without increasing the area of the sense circuit is desirable.

SUMMARY OF THE INVENTION

The present invention provides a sense circuit having an enhanced signal margin for electrical fuses by compensating a reference voltage of the sense circuit in proportion to the level of average leakage current in the bitcells of the electrical fuses.

In the present invention, an e-fuse sense circuit employs a single ended sense scheme in which the reference voltage is compensated for leakage. A reference voltage generator includes a pull-up resistor of similar value to the selected bitline pull-up resistor. As the sensing trip point is adjusted by selection of a bitline pull-up resistor, a pair of pull-up and pull-down resistors are adjusted together to adjust the AC impedance of the reference voltage generator.

A leakage-path simulation structure including a parallel connection of bitcells is added to the reference voltage generator. The leakage-path simulation structure imitates the bitcells on a bitline in the array of e-fuses. Leakage current on the bitline offsets the bitline voltage by a certain error voltage. The reference voltage generated in the reference voltage generator is also offset by a fraction, which is typically from 0.2× to 1.0×, of the error voltage to balance the shifts in the '1' and '0' margin levels in the presence of leakage.

In the present invention, a semiconductor circuit includes a reference voltage generator and at least one bitline unit. Each of the at least one bitline unit includes: first bitcells connected in a parallel connection between a bitline and electrical ground; a sense amplifier connected to the bitline; and a pull-up resistor circuit located between a power supply node and the bitline. The reference voltage generator includes: a voltage divider circuit connected to the power supply node and electrical ground and a reference voltage line; and a leakage current simulation circuit containing second bitcells connected in a parallel connection between the reference voltage line and electrical ground. The leakage current simulation circuit provides a leakage current between the reference voltage line and electrical ground. The sense amplifier generates an output by comparing a voltage in the reference voltage line and the bitline.

DETAILED DESCRIPTION OF THE INVENTION

Figure 1:
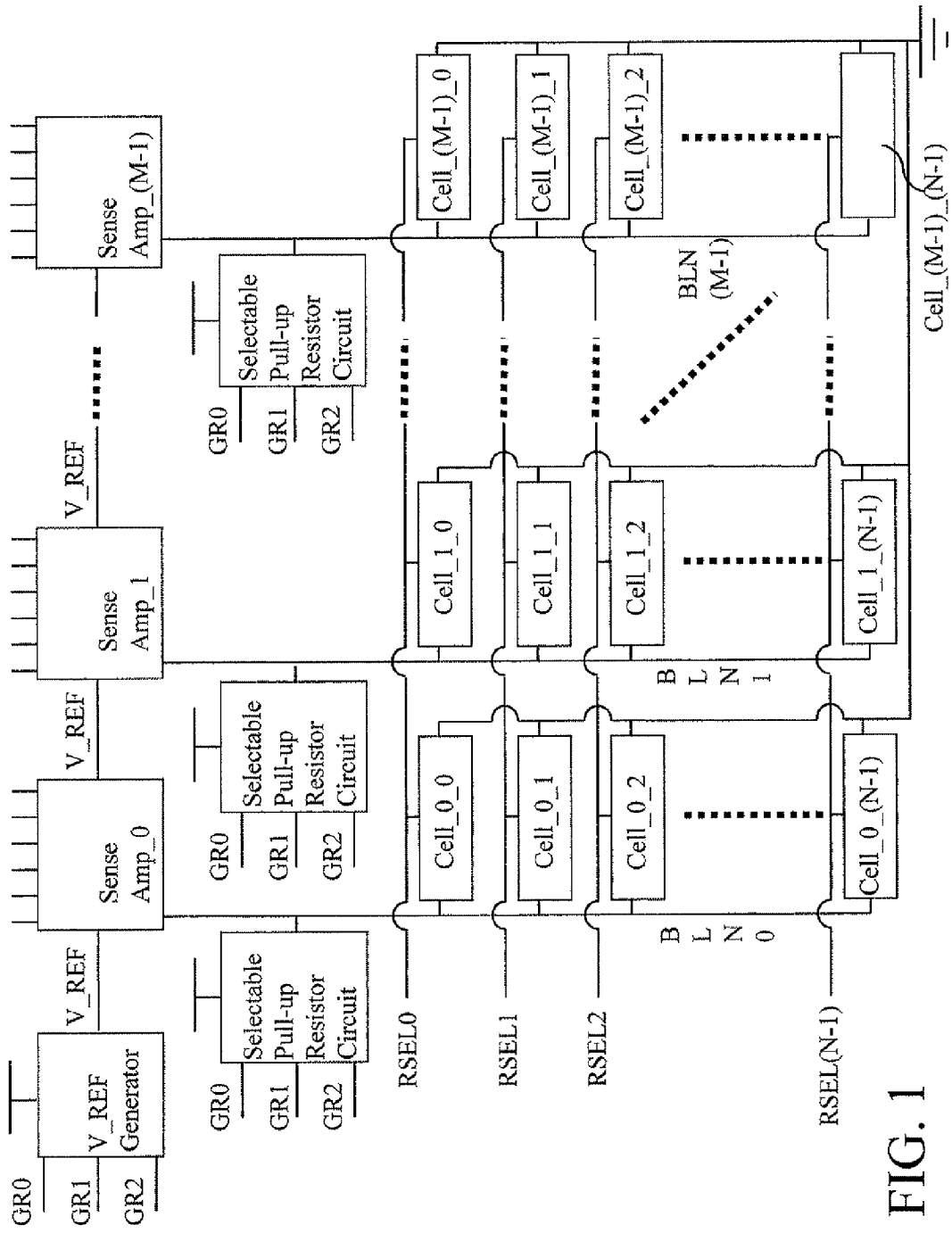
FIG. 1 is a circuit schematic for an exemplary semiconductor circuit including an array of bitcells, sense amplifiers, selectable pull-up resistor circuits, and a reference voltage generator according to the present invention.

As stated above, the present invention relates to a semiconductor device sense circuit, which is now described in detail with accompanying figures. Like and corresponding elements are referred to by like reference numerals. Proportions of various elements in the accompanying figures are not drawn to scale.

Referring to FIG. 1, a circuit schematic for an exemplary semiconductor circuit according to the present invention is shown. The exemplary semiconductor circuit includes a reference voltage generator and an array of bitline units. Each bitline unit includes a bitline, a sense amplifier, a selectable pull-up resistor circuit, and a one-dimensional array of first bitcells. The bitline units are arranged as a one-dimensional array. The direction of arrangement of the bitline units is called columns, i.e., the bitline units are arranged in columns.

A reference voltage V_REF is generated by the reference voltage generator, which is schematically shown as a "V_REF generator." The level of the reference voltage V_REF is selectable by setting values for setting control input nodes, which are labeled as GR0, GR1, and GR2. While the present invention is described with three setting control input node signals, the number of setting control input nodes may be any positive integer including 1. Such variations are explicitly contemplated herein.

The number of the bitline units is represented by "M," which may be any positive integer including 1. Typically, the bitline units have a same design. Typically, the number M may be from 10 to 10,000, although lesser and greater numbers for M are also contemplated herein. Each bitline unit is assigned a number within the one-dimensional array of the bitline units. The numbers assigned to the bitline units are referred to as column numbers, which ranges from 0 to (M−1).

The j-th bitline unit includes a j-th bitline, which is referred to as "BLN(j−1)." The sense amplifier of the j-th bitline unit is referred to as a j-th sense amplifier, or "Sense Amp (j−1)." The j-th bitline is connected to the j-th sense amplifier. The j-th bitline unit includes a selectable pull-up resistor circuit located between a power supply node and the j-th bitline. The j-th bitline unit further includes a set of first bitcells connected in a parallel connection between the j-th bitline and electrical ground. The number of the first bitcells in each bitline unit is herein referred to as "N," which may be any positive integer including 1. Typically, the number N may be from 4 to 4,096 ($=2^{12}$), although lesser and greater numbers for N are also contemplated herein.

Each of the first bitcells may include a memory structure that may be programmed to alter the resistance. Preferably, all of the first bitcells in the j-th bitline unit are programmable memory devices of the same type. More preferably, all of the first bitcells in the entirety of the bitline units in the exemplary semiconductor circuit are programmable memory devices of the same type. Frequently, all of the first bitcells in the entirety of the bitline units in the exemplary semiconductor circuit are programmable memory devices of identical design. The programmable memory devices that may be included in a first bitcell may be an electrical fuse or an electrical antifuse.

The direction of arrangement of the first bitcells within each bitline unit is called rows, i.e., the first bitcells are arranged in rows in each of the bitline units. Within the exemplary semiconductor circuit, the first bitcells constitute a two dimensional array. The first bitcell in row (i−1) and in column (j−1) is referred to as "Cell_j_j." Thus, the first bitcells constitute an N×M two-dimensional array.

The selectable pull-up resistor circuit within each bitline unit includes at least two resistors. The setting control input nodes, e.g., GR0, GR1, and GR2, are provided to each selectable pull-up resistor circuit to set the resistance of the selectable pull-up resistor circuit between the power supply node and the bitline. The settings of all of the selectable pull-up resistor circuits may be controlled simultaneously by the setting control inputs, which are connected to all of the selectable pull-up resistor circuits. Preferably, the same value of resistance is selected by the setting control inputs across all of the selectable pull-up resistor circuits. The value of resistance selected in the selectable pull-up resistor circuits is herein referred to as a selectable first resistance. The selectable first resistance is "selectable," i.e., may be selected from a plurality of possible values, through the setting control inputs.

The setting control units simultaneously select the level of the reference voltage V_REF, which is generated by the reference voltage generator by selecting the resistance between the power supply node and a reference voltage line. The reference voltage line may extend from the reference voltage generator to all of the sense amplifiers of each bitline unit so that the reference voltage V_REF is supplied to all sense amplifies. The sense amplifiers are labeled "Sense Amp_0," "Sense Amp_1," . . . , and "Sense Amp_(M−1)." In general, the j-th sense amplifier in the j-th column is labeled "Sense Amp_(j−1)."

Typically, each sense amplifier is connected to the power supply node, electrical ground, a set of control input nodes, and at least one output node. Typically, the control input nodes determine the operation of the sense amplifiers. The signal inputs to the j-th sense amplifier Sense Amp_(j−1) is provided by the reference voltage line and the j-th bitline BLN(j−1). When the sensing operation is enabled for the j-th sense amplifier Sense Amp_(j−1) through a set of control inputs, the j-th sense amplifier Sense Amp_(j−1) compares the voltage in the reference voltage line, which is the reference voltage V_REF, with the voltage in the j-th bitline BLN (j−1). Depending on which of the reference voltage V_REF and the voltage in the j-th bitline BLN(j−1) is higher, the voltage at the at least one output node of the j-th sense amplifier Sense Amp_(j−1) is determined. Thus, each of the sense amplifier includes a comparator device that compares the two input voltages and generates an output depending on the which voltage is higher between the two input voltages.

The sensing of the first bitcells may be performed row by row. First bitcells in the same row are connected by a row select line, which applies a control signal that selects the row or deselects the row. The row select lines are shown by lines labeled "RSEL0," "RSEL1," "RSEL2,", and "RSEL(N−1)." Each row select line transmits an independently controlled row select voltage. In general, the i-th row select line is referred to as "RSEL(i−1)." When a row select line is enabled to select that row, the electrical path between the bitlines and the electrical ground is connected within each of the first bitcells on the enabled row. When a row select line is disabled to deselect that row, the electrical path between the bitlines and the electrical ground is nominally disconnected within each of the first bitcells on the enabled row. Each of the first bitcells includes an electrical switch, which may be a field effect transistor. The electrical switch is controlled by the signal in a connected row select line. For example, the electrical switch is a field effect transistor, the signal in the connected row select line may be applied to the gate of the field effect transistor.

Figure 2:
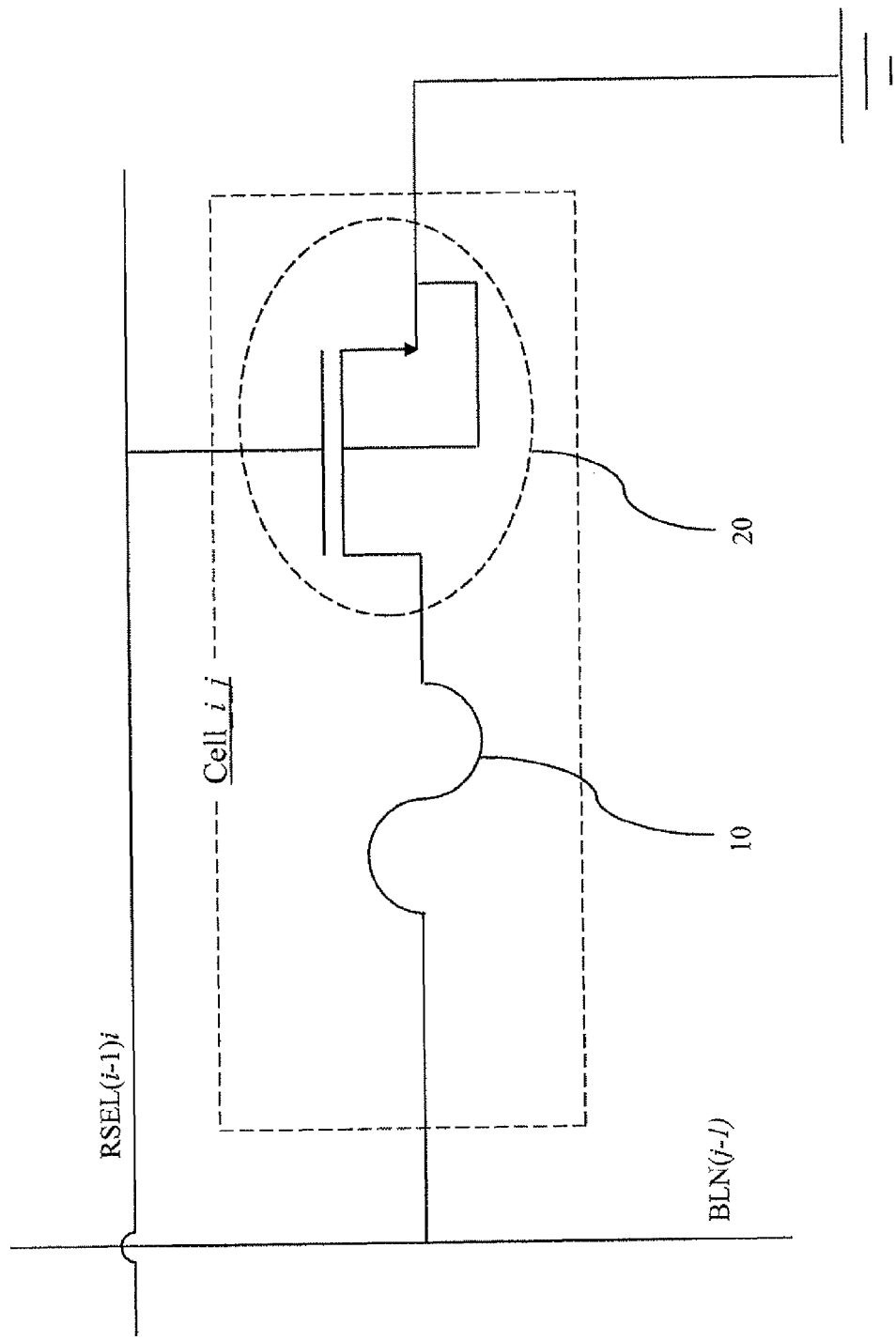
FIG. 2 is a circuit schematic illustrating contents of an exemplary bitcell according to the present invention.

Referring to FIG. 2, an exemplary first bitcell is shown. The exemplary first bitcell may be a first bitcell located at the i-th row and the j-th column, i.e., the Cell_i_j in the exemplary semiconductor circuit of FIG. 1. Cell_i_j includes a serial connection of an electrically programmable fuse (e-fuse) 10 and a programming transistor 20. The e-fuse 10 may be any of the electrical fuses known in the art including electrical fuses programmable by electromigration of metal-semiconductor alloys such as metal silicides. One node of the e-fuse 10 may be directly connected to the j-th bitline BLN(j−1), and the other node of the e-fuse 10 may be directly connected to a terminal of the programming transistor 20. The programming transistor 20 may be an n-type field effect transistor. The source of the programming transistor 20 may be connected to electrical ground and the drain of the programming transistor 20 may be directly connected to a node of the e-fuse 10. The gate of the programming transistor 20 may be connected to the i-th row select line RSEL(i−1). The source of the programming transistor 20 may be connected directly to electrical ground, or may be connected to electrical ground through another transistor (not shown).

Even if the i-th row select line RSEL(i−1) is deselected, i.e., has a low voltage corresponding to the off-state of the programming transistor 20, electrical current at the level of the off-current of the programming transistor 20 may flow between the j-th bitline BLN(j−1) and electrical ground through Cell_i_j. If the e-fuse 10 is in a programmed state having a high resistance value, the level of the off-current through Cell_i_j may be limited by the resistance of the e-fuse 10, which typically has a resistance exceeding 1 kOhms. More typically, the resistance of the e-fuse 10 exceeds 10 kOhms in a programmed state so that the leakage current through Cell_i_j becomes negligible if the e-fuse 10 is in a programmed state.

In an unprogrammed state, however, the e-fuse 10 has a low resistance value, which is from 50 Ohms to 300 Ohms, and more typically from 100 Ohms to 200 Ohms. The unprogrammed state of the e-fuse 10 is an intact state of the e-fuse 10, i.e., the physical structure of the e-fuse 10 is not altered from the state in which the e-fuse 10 is manufactured. In this case, the resistance of the e-fuse 10 is not high enough to sufficiently limit the leakage current through Cell_i_j. In this case, even if the i-th row select line RSEL(i−1) is deselected, a substantial amount of leakage current may flow from power supply node through a selectable pull-up resistor circuit, the j-th bitline BLN(j−1), and Cell_i_j to electrical ground.

Ideally, the j-th sense amplifier Sense Amp J_(j−1) senses the state of a selected programmable memory device, e.g., an e-fuse, within a single selected first bitcell on the j-th bitline BLN(j−1). The state of the selected programmable memory device is determined by measuring the resistance of the bitcell including the selected programmable memory device. The resistance of the bitcell including the selected programmable memory device is determined by selecting a selectable first resistance for the resistance of the selectable pull-up resistor circuit between the power supply node and the j-th bitline BLN(j−1). The selectable pull-up resistor circuit and the selected programmable memory device function as a voltage divider. Since the value of the selectable first resistance is known, measurement of the voltage at the j-th bitline BLN(j−1) determines the resistance of the selected programmable memory device. Based on the measured values of the resistance of the selected programmable memory device, the state of the selected programmable memory device is determined. The data, i.e., "0" or "1," stored as the state of the selected programmable memory device is sensed by the j-th sense amplifier Sense Amp_(j−1) in this case.

Leakage current through the rest of the first bitcells between the j-th bitline BLN(j−1) and electrical ground introduces unpredictable uncertainty in the measured value of the resistance of the selected programmable memory device. The leakage paths through the other first bitcells on the j-th bitline BLN(j−1) effectively functions as a set of resistors in a parallel connection with the selected first bitcell between the j-th bitline BLN(j−1) and electrical ground. The net effect is to reduce the apparent resistance of the selected first bitcell. The leakage current of the unselected first bitcells varies with the process variations inherent in the manufacturing process for a semiconductor chip including the switching device, e.g., the programming transistor 20, in the first bitcells. In the present invention, the leakage current through the unselected first bitcells on a bitline is compensated for by a leakage current simulation circuit that is incorporated into the reference voltage generator.

Figure 3:
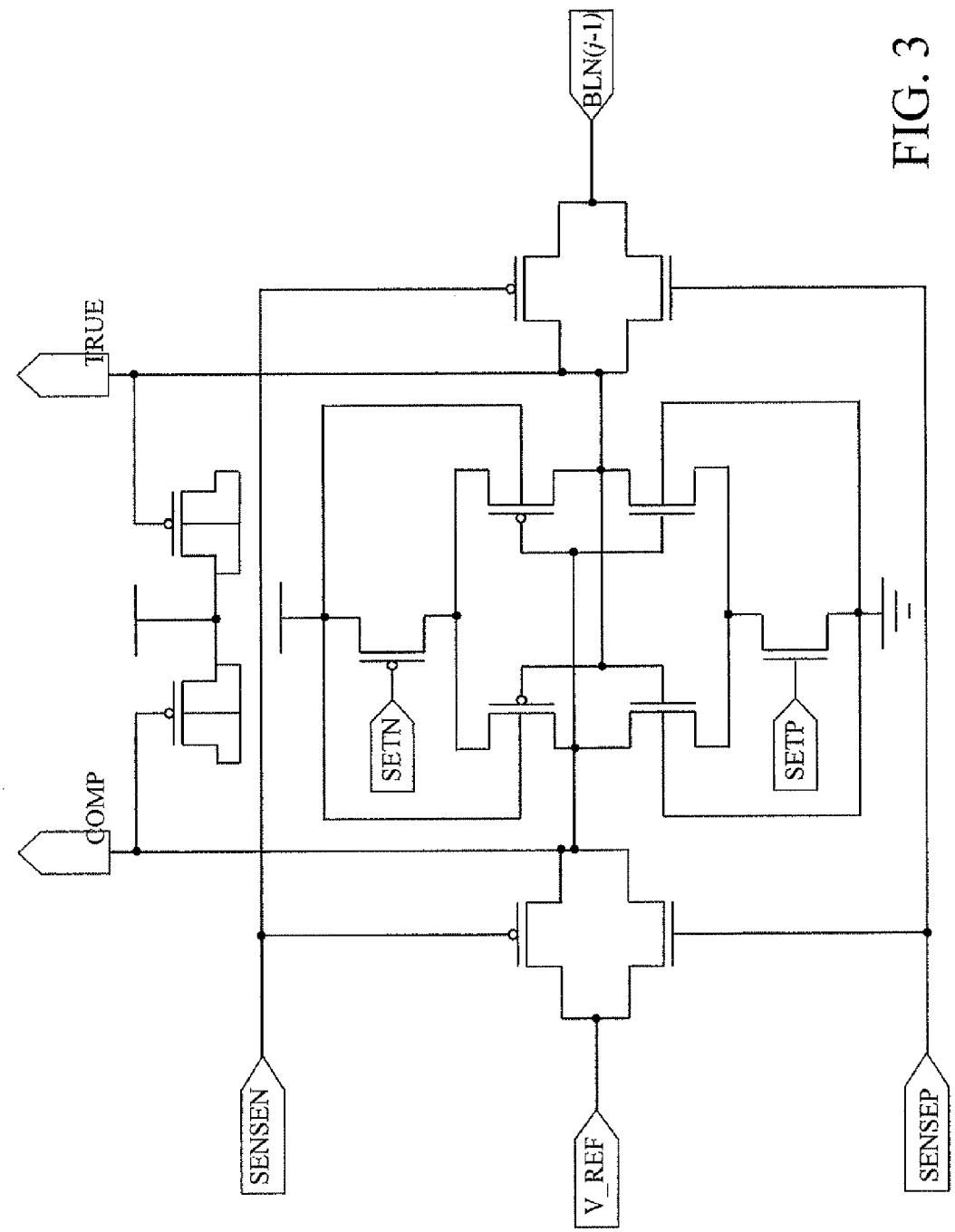
FIG. 3 is a circuit schematic for an exemplary sense amplifier that may be employed in the exemplary semiconductor circuit according to the present invention.

Referring to FIG. 3, a circuit schematic is shown for an exemplary sense amplifier that may be employed as a j-th sense amplifier Sense Amp_(j−1) in the exemplary semiconductor circuit of FIG. 1. The exemplary sense amplifier is a cross-coupled differential amplifier that compares two input voltages. The first input voltage is the voltage at the j-th bitline BLN(j−1), and the second voltage is the reference voltage V_REF that is supplied by the reference voltage generator. SETP, SETN, SENSEP, and SENSEN are input control signals that enable the j-th sense amplifier Sense Amp_(j−1). TRUE and COMP are a true output signal and a complementary output signal, respectively. The values of TRUE and COMP change based on which of the two input voltages is higher relative to the other. For example, if the voltage at the j-th bitline BLN(j−1) is higher than the reference voltage V_REF, the output at the TRUE output node is high, i.e., close to the power supply voltage, and the output at the COMP output node is low, i.e., close to electrical ground. If the voltage at the j-th bitline BLN(j−1) is lower than the reference voltage V_REF, the output at the TRUE output node is low, and the output at the COMP output node is high. Any other comparator may be employed that compares the voltages at two input nodes and generates an output that depends on which of the two input voltages is higher.

Figure 4:
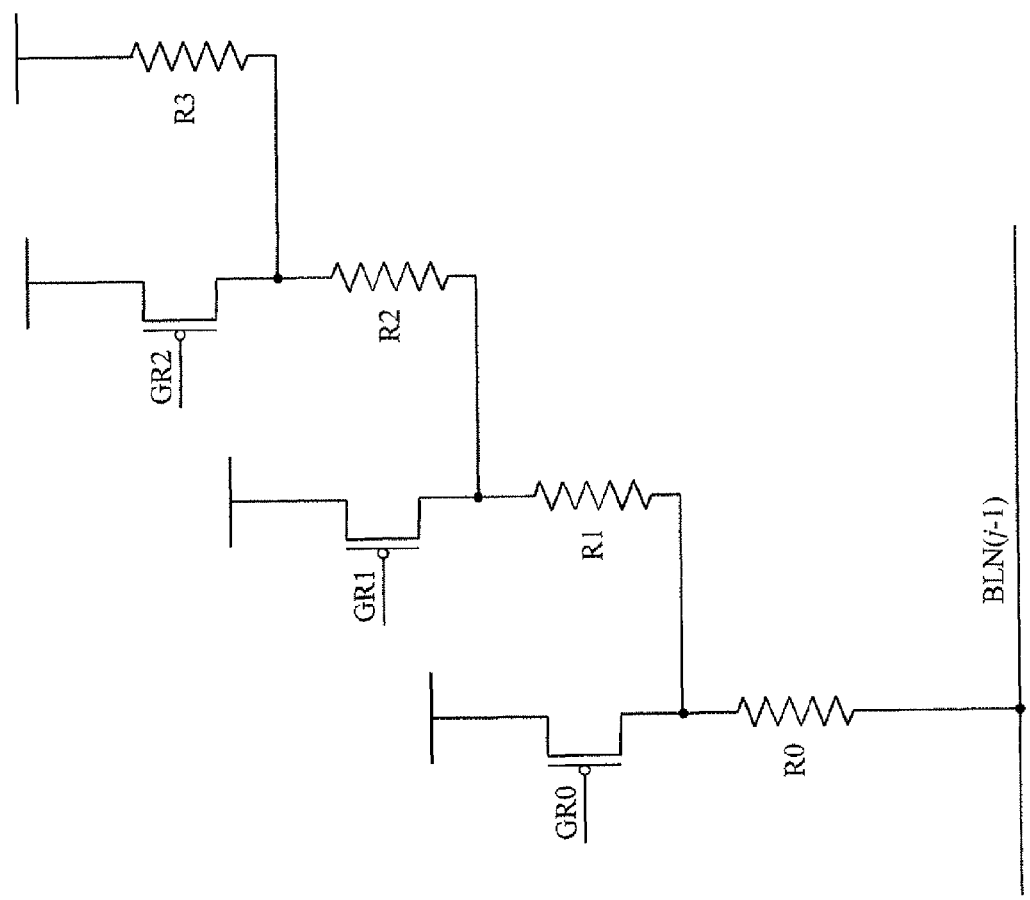
FIG. 4 is a circuit diagram for an exemplary selectable pull-up resistor circuit according to the present invention.

FIG. 4 is a circuit diagram for an exemplary selectable pull-up resistor circuit, which may be employed as a selectable pull-up resistor circuit in the exemplary semiconductor circuit of FIG. 1. The exemplary pull-up resistor circuit may be connected to a bitline such as a j-th bitline BLN(j−1) in the exemplary semiconductor circuit of FIG. 1.

The exemplary pull-up resistor circuit includes a plurality of resistors connected in a series connection between the power supply node and the bitline. For example, the exemplary pull-up resistor circuit may include a series connection of a first pull-up resistor R0, a second pull-up resistor R1, a third pull-up resistor R3, and a fourth pull-up resistor R4 in that order between a bit line and the power supply line. Typical values for the first pull-up resistor R0, the second pull-up resistor R1, the third pull-up resistor R3, and the fourth pull-up resistor R4 range from 500 Ohms to 10 kOhms.

The exemplary pull-up resistor circuit further includes at least one pull-up p-type field effect transistor connected between the power supply node and a node between an adjoining pair of resistors within the plurality of resistors. For example, a first pull-up field effect transistor may be formed between the power supply node and a node between the first pull-up resistor R0 and the second pull-up resistor R1, a second pull-up field effect transistor may be formed between the power supply node and a node between the second pull-up resistor R1 and the third pull-up resistor R2, a third pull-up field effect transistor may be formed between the power supply node and a node between the third pull-up resistor R2 and the fourth pull-up resistor R3. The gate of the first pull-up field effect transistor may be connected to a first setting control input node GR0, the gate of the second pull-up field effect transistor may be connected to a second setting control input node GR1, and the gate of the third pull-up field effect transistor may be connected to a third setting control input node GR2.

If the voltage of the first setting control input node GR0 is low, the power supply node is connected to an end of the first pull-up resistor R0, and the resistance of the exemplary pull-up resistor circuit, which is referred to as a selectable first resistance, is the resistance of the first pull-up resistor R0. If the voltage of the first setting control input node GR0 is high and the voltage of the second setting control input node GR1 is low, the power supply node is connected to an end of the second pull-up resistor R1, and the resistance of the exemplary pull-up resistor circuit is the sum of the resistance of the first pull-up resistor R0 and the resistance of the second pull-up resistor R1. If the voltages of the first setting control input node GR0 and the second setting control input node GR1 are high and the voltage of the third setting control input node GR2 is low, the power supply node is connected to an end of the third pull-up resistor R2, and the resistance of the exemplary pull-up resistor circuit is the sum of the resistance of the first pull-up resistor R0, the resistance of the second pull-up resistor R1, and the resistance of the third pull-up resistor R2. If the voltages of the first through third setting control input nodes (GR0, GR1, GR2) are high, the power supply node is connected to an end of the fourth pull-up resistor R3, and the resistance of the exemplary pull-up resistor circuit is the sum of the resistance of the first pull-up resistor R0, the resistance of the second pull-up resistor R1, the resistance of the third pull-up resistor R2, and the resistance of the fourth pull-up resistor R3. Typically, the selectable first resistance is from 1,000 Ohms to 10,000 Ohms, although lesser and greater values for the selectable first resistance are also contemplated herein.

While the present invention is described with four resistors and three pull-up p-type field effect transistors, the present invention may be practiced with different numbers of resistors or different numbers of pull-up p-type field effect transistors. Further, the present invention may be practiced with a fixed value of resistance for the pull-up resistor circuits. Such variations are explicitly contemplated herein.

Figure 5:
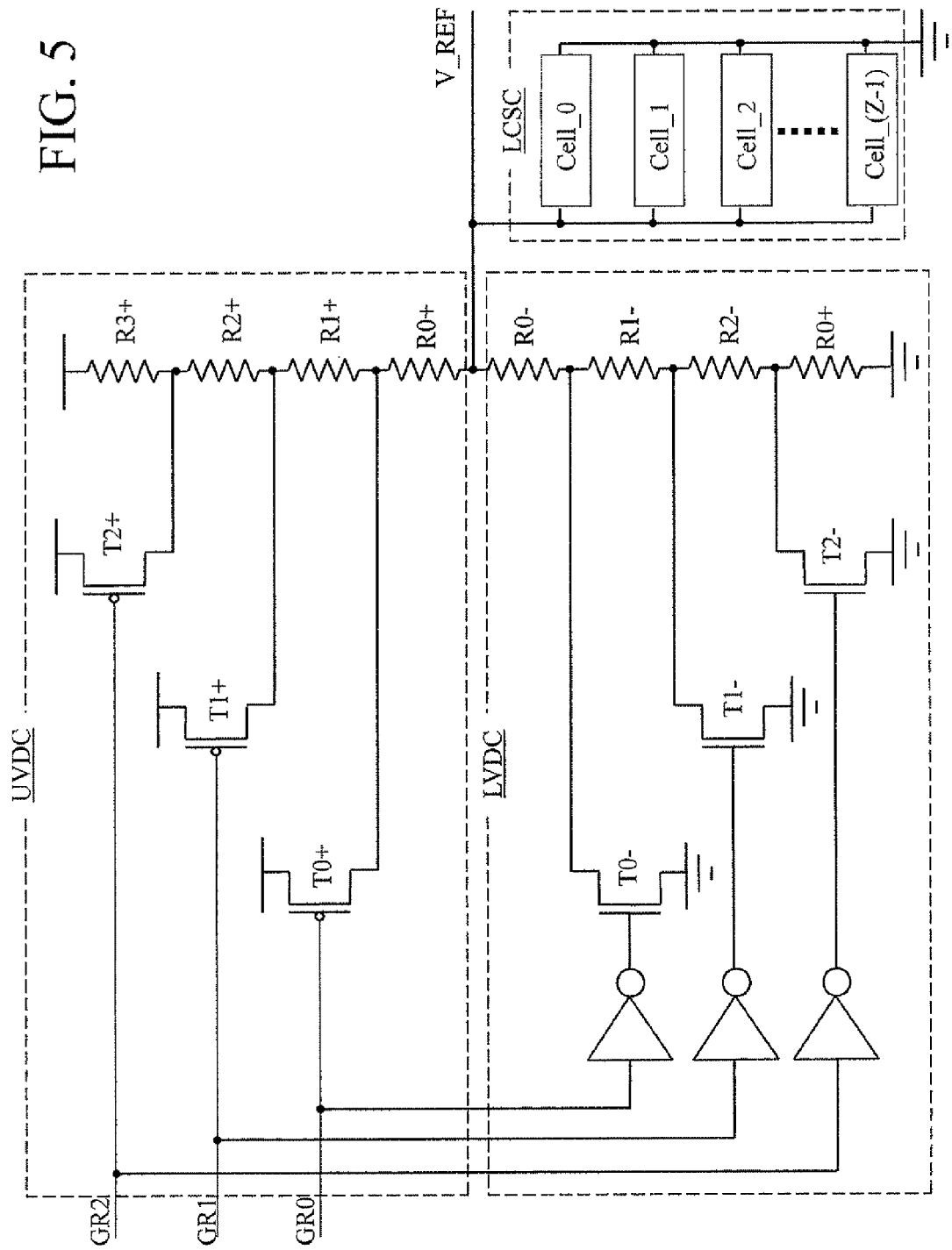
FIG. 5 is a circuit diagram for an exemplary reference voltage generator according to the present invention.

Referring to FIG. 5, an exemplary reference voltage generator that may be employed as a reference voltage generator in the exemplary semiconductor circuit of FIG. 1 is shown. The exemplary reference voltage generator includes a voltage divider circuit and a leakage current simulation circuit LCSC. One end of the voltage divider circuit is connected to the power supply node and another end of the voltage divider circuit is connected to electrical ground. A middle portion of the voltage divider circuit is connected to the reference voltage line. One end of the leakage current simulation circuit LCSC is connected to the reference voltage line, and another end of the leakage current simulation circuit LCSC is connected to electrical ground.

The leakage current simulation circuit LCSC includes second bitcells connected in a parallel connection between the reference voltage line V ref and electrical ground. The number of the second bitcells may be any positive integer including 1, and is herein referred to as integer "Z." The second bitcells are labeled as "Cell_0," "Cell_1," "Cell_2,"..., and "Cell_(Z−1)."

The voltage divider circuit includes an upper voltage divider circuit UVDC and a lower voltage divider circuit LVDC that are joined at the reference voltage line. Signals from common setting control input nodes (GR0, GR1, GR2) are provided to the upper voltage divider circuit UVDC and the lower voltage divider circuit LVDC. One end of the upper voltage divider circuit UVDC is connected to the power supply node, and another end of the upper voltage divider circuit UVDC is connected to the reference voltage line. The lower voltage divider circuit LVDC and the leakage current simulation circuit LCSC are connected in a parallel connection between the reference voltage line and electrical ground.

The leakage current simulation circuit LCSC provides a leakage current between the reference voltage line and electrical ground. The voltage divider circuit (UVDC, LVDC) provides a selectable second resistance between the power supply node and the reference voltage line, and a selectable third resistance between the reference voltage line and electrical ground. The selectable second resistance is the resistance of the upper voltage divider circuit UVDC between the power supply node and the reference voltage line. The selectable third resistance is the resistance of the lower voltage divider circuit LVDC between the reference voltage line and electrical ground.

Preferably, the upper voltage divider circuit UVDC is configured such that the selectable second resistance is the same as the selectable first resistance irrespective of the setting of the setting control input nodes (GR0, GR1, GR2). The selectable third resistance is selected based on a setting for the selectable second resistance through the signals in the setting control input nodes (GR0, GR1, GR2). Preferably, the lower voltage divider circuit LVDC is configured such that the ratio between the selectable second resistance to the selectable third resistance is constant irrespective of the setting of the setting control input nodes (GR0, GR1, GR2), i.e., irrespective of the setting selected for the selectable second resistance.

The upper voltage divider circuit UVDC includes at least one p-type field effect transistor having a source connected to the power supply node, a drain connected to a node between two upper resistors, and a gate connected to a setting control input node. Further, the upper voltage divider circuit UVDC includes a series connection of at least two upper resistors between the reference voltage line and the power supply node. The at least two upper resistors includes the two upper resistors.

For example, the upper voltage divider circuit UVDC may include a series connection of a first upper resistor R0+, a second upper resistor R1+, a third upper resistor R2+, and a fourth upper resistor R3+. The first upper resistor R0+ is connected to the reference voltage line, and the fourth upper resistor R3+ is connected to the power supply node.

The upper voltage divider circuit UVDC may further include a first upper p-type field effect transistor T0+, a second upper p-type field effect transistor T1+, and a third upper p-type field effect transistor T2+. The source of each of the first through third p-type field effect transistors (T0+, T1+, T2+) is connected to the power supply node. The drain of the first upper p-type field effect transistor T0+ is connected to the node between the first upper resistor R0+ and the second upper resistor R1+, the drain of the second upper p-type field effect transistor T1+ is connected to the node between the second upper resistor R1+ and the third upper resistor R2+, and the drain of the third upper p-type field effect transistor T2+ is connected to the node between the third upper resistor R2+ and the fourth upper resistor R3+. The gate of the first upper p-type field effect transistor T0+ is connected to the first setting control node GR0, the gate of the second upper p-type field effect transistor T1+ is connected to the second setting control node GR1, and the gate of the third upper p-type field effect transistor T2+ is connected to the third setting control node GR2.

If the voltage of the first setting control input node GR0 is low, the power supply node is connected to an end of the first upper resistor R0+ without any substantial voltage drop across the first upper n-type field effect transistor T0+, and the selectable second resistance is the resistance of the first upper resistor R0+. If the voltage of the first setting control input node GR0 is high and the voltage of the second setting control input node GR1 is low, the power supply node is connected to an end of the second upper resistor R1+, and the second selectable resistance is the sum of the resistance of the first upper resistor R0+ and the resistance of the second upper resistor R1+. If the voltages of the first setting control input node GR0 and the second setting control input node GR1 are high and the voltage of the third setting control input node GR2 is low, the power supply node is connected to an end of the third upper resistor R2+, and the second selectable resistance is the sum of the resistance of the first upper resistor R0+, the resistance of the second upper resistor R1+, and the resistance of the third upper resistor R2+. If the voltages of the first through third setting control input nodes (GR0, GR1, GR2) are high, the power supply node is connected to an end of the fourth upper resistor R3+, and the selectable second resistance is the sum of the resistance of the first upper resistor R0+, the resistance of the second upper resistor R1+, the resistance of the third upper resistor R2+, and the resistance of the fourth upper resistor R3+. Typically, the selectable second resistance is from 1,000 Ohms to 10,000 Ohms, although lesser and greater values for the selectable first resistance are also contemplated herein.

The sequence of resistance for successive resistors in the plurality of resistors within the exemplary pull-up resistor circuit of FIG. 4 is the same as a sequence of resistance for successive resistors in the series connection of the at least two upper resistors in the upper voltage divider circuit UVDC. The sequence of resistance for successive resistors in the plurality of resistors within the exemplary pull-up resistor circuit of FIG. 4 begins with a resistor located most proximate to the bitline. The sequence of resistance for successive resistors in the series connection of the at least two upper resistors in the upper voltage divider circuit UVDC begins with a resistor located most proximate to the reference voltage line among the series connection of the at least two upper resistors in the upper voltage divider circuit UVDC.

For example, the resistance of the first pull-up resistor R0 in the exemplary pull-up resistor circuit of FIG. 4 is the same as the resistance of the first upper resistor R0+, the resistance of the second pull-up resistor R1 in the exemplary pull-up resistor circuit of FIG. 4 is the same as the resistance of the second upper resistor R1+, the resistance of the third pull-up resistor R2 in the exemplary pull-up resistor circuit of FIG. 4 is the same as the resistance of the third upper resistor R2+, the resistance of the fourth pull-up resistor R3 in the exemplary pull-up resistor circuit of FIG. 4 is the same as the resistance of the fourth upper resistor R3+. Because the same setting control inputs are applied to the exemplary pull-up resistor circuit of FIG. 4 and the exemplary reference voltage generator, the selectable first resistance is the same as the selectable second resistance irrespective of the settings of the setting control inputs.

The lower voltage divider circuit LVDC includes at least one n-type field effect transistor having a source connected to electrical ground, a drain connected to a node between two lower resistors, and a gate connected to a setting control input node. Further, the lower voltage divider circuit LVDC includes a series connection of at least two lower resistors between the reference voltage line and electrical ground. The at least two lower resistors includes the two lower resistors.

For example, the lower voltage divider circuit LVDC may include a series connection of a first lower resistor R0−, a second lower resistor R1−, a third lower resistor R2−, and a fourth lower resistor R3−. The first lower resistor R0− is connected to the reference voltage line, and the fourth lower resistor R3− is connected to electrical ground.

The lower voltage divider circuit LVDC may further include a first lower n-type field effect transistor T0−, a second lower n-type field effect transistor T1−, and a third lower n-type field effect transistor T2−. The source of each of the first through third n-type field effect transistors (T0−, T1−, T2−) is connected to electrical ground. The drain of the first lower n-type field effect transistor T0− is connected to the node between the first lower resistor R0− and the second lower resistor R1−, the drain of the second lower n-type field effect transistor T1− is connected to the node between the second lower resistor R1− and the third lower resistor R2−, and the drain of the third lower n-type field effect transistor T2− is connected to the node between the third lower resistor R2− and the fourth lower resistor R3−. The gate of the first lower n-type field effect transistor T0− is connected to the logic-inverted first setting control node GR0, the gate of the second lower n-type field effect transistor T1− is connected to the logic-inverted second setting control node GR1, and the gate of the third lower n-type field effect transistor T2− is connected to the logic-inverted third setting control node GR2.

If the voltage of the first setting control input node GR0 is low, electrical ground is connected to an end of the first lower resistor R0− without any substantial voltage drop across the first lower n-type field effect transistor T0−, and the selectable second resistance is the resistance of the first lower resistor R0−. If the voltage of the first setting control input node GR0 is high and the voltage of the second setting control input node GR1 is low, electrical ground is connected to an end of the second lower resistor R1−, and the second selectable resistance is the sum of the resistance of the first lower resistor R0− and the resistance of the second lower resistor R1−. If the voltages of the first setting control input node GR0 and second setting control input node GR1 are high and the voltage of the third setting control input node GR2 is low, electrical ground is connected to an end of the third lower resistor R2−, and the second selectable resistance is the sum of the resistance of the first lower resistor R0−, the resistance of the second lower resistor R1−, and the resistance of the third lower resistor R2−. If the voltages of the first through third setting control input nodes (GR0, GR1, GR2) are high, electrical ground is connected to an end of the fourth lower resistor R3−, and the selectable second resistance is the sum of the resistance of the first lower resistor R0−, the resistance of the second lower resistor R1−, the resistance of the third lower resistor R2−, and the resistance of the fourth lower resistor R3−. Typically, the selectable second resistance is from 1,000 Ohms to 10,000 Ohms, although lesser and greater values for the selectable first resistance are also contemplated herein.

The sequence of resistance for successive resistors in the lower voltage divider circuit LVDC is a scalar multiple of a sequence of resistance for successive resistors in the series connection of the at least two lower resistors in the lower voltage divider circuit LVDC. The sequence of resistance for successive resistors in the series connection of the at least two lower resistors in the lower voltage divider circuit LVDC begins with a resistor located most proximate to the reference voltage line among the series connection of the at least two lower resistors in the lower voltage divider circuit LVDC.

For example, the ratio of the resistance of the first lower resistor R0− to the resistance of the first upper resistor R0+, the ratio of the resistance of the second lower resistor R1− to the resistance of the second upper resistor R1+, the ratio of the resistance of the third lower resistor R2− to the resistance of the second upper resistor R2+, the ratio of the resistance of the fourth lower resistor R3− to the resistance of the fourth upper resistor R3+ are the same number. The number may be from 0.2 to 4, and typically from 0.4 to 2, and preferably about 0.7.

Because the same setting control inputs are applied to the lower n-type field effect transistor (T0−, T1−, T2−) and to the upper p-type field effect transistor (T0+, T1+, T2+), the ratio between the selectable third resistance to the selectable second resistance is the same irrespective of the settings of the setting control inputs.

The input impedance R_AC of the voltage divider circuit (UVDC, LVDC) is the parallel resistance of the selectable second resistance and the selectable third resistance. This relationship is given by:

$$\frac{1}{R\_AC} = \frac{1}{S2R} + \frac{1}{S3R},$$

in which S2R is the selectable second resistance and S3R is the selectable third resistance.

The input impedance R_AC varies with the setting selected for the selectable second resistance, i.e., with the settings of the setting control inputs. However, the ratio of the selectable second resistance to the selectable third resistance remains constant irrespective of the settings of the setting control inputs.

Preferably, each of the second bitcells in the leakage current simulation circuit LCSC includes a series connection of a second e-fuse and a second programming transistor. The second bitcells have identical design within the leakage current simulation circuit LCSC. Preferably, the second bitcells have identical design as the first bitcells within the at least one bitline unit. For example, the first bitcells and the second bitcells may employ the same design as illustrated in FIG. 2. In this case, the first programming transistor and the second programming transistor have a same design and same leakage characteristics. The first e-fuse in each of the first bitcells and the second c-fuse in each of the second bitcells may have a same design to facilitate matching of the first bitcells with the second bitcells.

The leakage characteristics of the leakage current simulation circuit LCSC is set to match a projected leakage characteristics of the first bitcells within one of the at least one bitline units. This may be effected by employing the same type of devices in the leakage current simulation circuit LCSC as in the at least one bitline units. Typically, the leakage current between the reference voltage line and electrical ground through the leakage current simulation circuit generates a leakage current between 5% and 100% of a leakage current from one of the at least one bitline unit to electrical ground in the absence of any programming of any of the first bitcells. Typically, the target level of the leakage current in the leakage current simulation circuit LCSC is a projected fraction of programmable memory devices in a typical bitline unit times the leakage current from one of the at least one bitline unit to electrical ground in the absence of any programming of any of the first bitcells. The projected fraction depends on the application of the programmable memory devices, and may be about 50%.

In general, each of the at least one bitline unit includes a first number of first bitcells, and the reference voltage generator includes a second number of second bitcells within the leakage current simulation circuit LCSC. The second number is between 25% and 400% of the first number. The ratio of the second number to the first number may be affected by the projected fraction of programmable memory devices and additional leakage current that may be attributable to non-selected bitline units, i.e., the additional leakage current through the non-selected bitline units between the reference voltage line and electrical ground.

Figure 6:
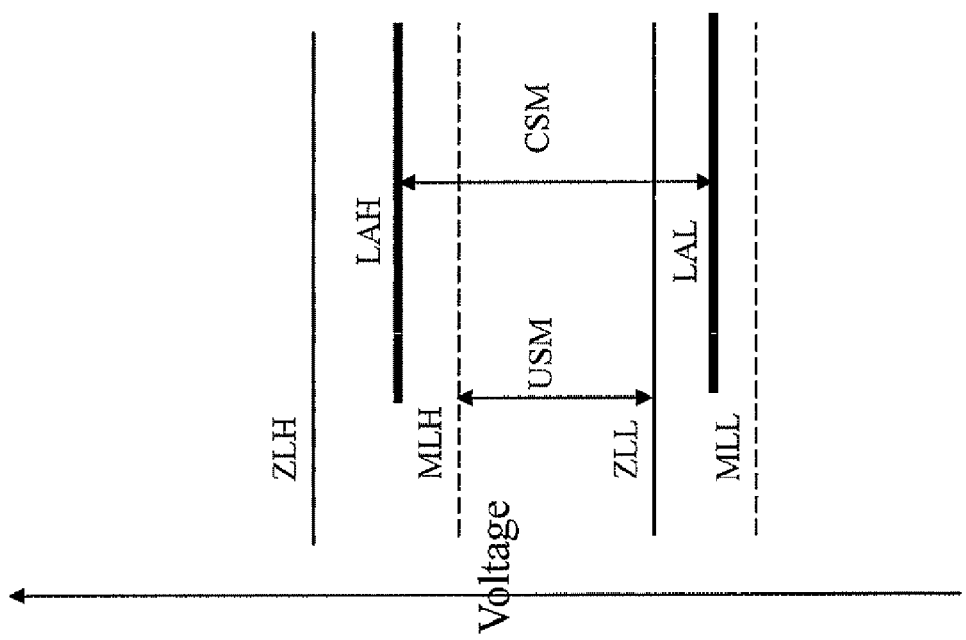
FIG. 6 is a diagram that illustrates modification of a trip point as a function of a leakage current according to the present invention.

Referring to FIG. 6, a diagram of sense voltage settings illustrates modification of a trip point as a function of a leakage current according to the present invention. In the absence of any leakage current through the bitline units, a programmed memory device in a selected first bitcell generates a voltage that is represented as a zero-leakage high level ZLH, while an unprogrammed memory device in a selected first bitcell generates a voltage that is represented as a zero-leakage low level ZLL. The difference between the zero-leakage high level ZLH and the zero-leakage low level ZLL is referred to as a zero-leakage sense margin, which is a permissible range of voltages for the reference voltage V_REF for a functional sense amplifier if the bitline units do not have any leakage current.

In the presence of leakage current through the bitline units, the voltage at the bitline decreases during sensing. The case of a circuit having maximum permissible leakage current by design is considered herein. If the semiconductor devices in the first bitcells have a maximum leakage level, a programmed memory device in a selected first bitcell generates a voltage that is represented as a maximum-leakage high level MLH, while an unprogrammed memory device in a selected first bitcell generates a voltage that is represented as a maximum-leakage low level MLL. The difference between the maximum-leakage high level MLH and the maximum-leakage low level MLL is referred to as a maximum-leakage sense margin, which is a permissible range of voltages for the reference voltage V_REF for a functional sense amplifier in the case of the maximum leakage level allowed by design.

In practice, it is not possible to predict how much leakage a particular hardware has because statistical variation during manufacturing is unavoidable. Thus, the target for the reference voltage for a sense amplifier needs to be voltage between the maximum-leakage high level MLH and the zero-leakage low level ZLL. The range for the target for the reference voltage is referred to as an uncompensated sense margin USM. The uncompensated sense margin USM is reduced with the variations in the leakage current through the first bitcells. Typical values of the uncompensated sense margin USM may be from 50 mV to 100 mV.

In general, the decrease in the voltage at the bitline during sensing of a selected first bitcell is affected by the amount of leakage current through other first bitcells on the same bitline and through devices on other bitlines. The programmed memory device in a selected first bitcell generates a voltage that is represented as a leakage-affected high level LAH, while an unprogrammed memory device in a selected first bitcell generates a voltage that is represented as a leakage affected low level LAL. The leakage-affected high level LAH is between the zero-leakage high level ZLH and the maximum-leakage high level MLH. The leakage-affected low level LAL is between the zero-leakage high low ZLL and the maximum-leakage low level MLL. The difference between the leakage-affected high level LAH and the leakage affected low level LAL is referred to as a leakage-affected sense margin, which is a permissible range of voltages for the reference voltage V_REF for a functional sense amplifier. This range is referred to as a compensated sense margin CSM, which is greater than the uncompensated sense margin USM. Typical values of the compensated sense margin CSM may be from 100 mV to 200 mV.

In the present invention, the shift in the leakage-affected low level LAL from the zero-leakage high level ZLH and the shift of the leakage-affected low level LAL from the zero-leakage low level ZLL are approximated by the leakage current simulation circuit LCSC. The target for the reference voltage V_REF in the absence of leakage is set at a mid-point between the zero-leakage high level ZLH and the zero-leakage low level ZLL. The shift in the leakage-affected low level LAL from the zero-leakage high level ZLH and the shift of the leakage-affected low level LAL from the zero-leakage low level ZLL induces a corresponding shift in the reference voltage V_REF as the leakage current through the leakage current simulation circuit LCSC. Thus, almost all of the compensated sense margin CSM may be used to account for voltage variations due to other circuit operational factors, thereby rendering the sense circuit of the present invention more robust against process variations and more reliable in terms of accuracy of sensing.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor circuit comprising a reference voltage generator and at least one bitline unit,
   wherein each of said at least one bitline unit comprises:
      first bitcells connected in a parallel connection between a bitline and electrical ground;
      a sense amplifier connected to said bitline; and
      a pull-up resistor circuit located between a power supply node and said bitline,
   wherein said reference voltage generator comprises:
      a voltage divider circuit connected to said power supply node and electrical ground and a reference voltage line; and
      a leakage current simulation circuit including second bitcells connected in a parallel connection between said reference voltage line and said electrical ground, wherein said leakage current simulation circuit provides a leakage current between said reference voltage line and electrical ground,
   and wherein said sense amplifier generates an output by comparing a voltage in said reference voltage line and said bitline.

2. The semiconductor circuit of claim 1, wherein each of said first bitcells includes a series connection of an electrically programmable fuse (e-fuse) and a programming transistor.

3. The semiconductor circuit of claim 1, wherein said pull-up resistor circuit provides a selectable first resistance between said power supply node and said bitline, and wherein said voltage divider circuit provides a selectable second resistance between said power supply node and said reference voltage line.

4. The semiconductor circuit of claim 3, wherein said pull-up resistor circuit and said voltage divider circuit are configured so that said selectable first resistance is the same as said selectable second resistance.

5. The semiconductor circuit of claim 4, wherein said voltage divider circuit provides a selectable third resistance between said reference voltage line and electrical ground, and wherein said selectable third resistance is selected based on a setting for said selectable second resistance.

6. The semiconductor circuit of claim 5, wherein a ratio between said selectable second resistance to said selectable third resistance is constant irrespective of a setting selected for said selectable second resistance.

7. The semiconductor circuit of claim 6, wherein an alternating current (AC) input impedance of said voltage divider circuit varies with a setting selected for said selectable second resistance.

8. The semiconductor circuit of claim 1, wherein said voltage divider circuit comprises:
   at least one p-type field effect transistor having a source connected to said power supply node, a drain connected to a node between two upper resistors, and a gate connected to a setting control input node; and
   at least one n-type field effect transistor having a source connected to electrical ground, a drain connected to a node between two lower resistors, and a gate connected to said control input node through an inverter.

9. The semiconductor circuit of claim 8, further comprising:
   a series connection of at least two upper resistors between said reference voltage line and said power supply node, wherein said at least two upper resistors includes said two upper resistors; and
   a series connection of at least two lower resistors between said reference voltage line and electrical ground, wherein said at least two lower resistors includes said two lower resistors.

10. The semiconductor circuit of claim 9, wherein said pull-up resistor circuit comprises:
    a plurality of resistors connected in a series connection between said power supply node and said bitline; and
    at least another p-type field effect transistor connected between said power supply node and a node between an adjoining pair of resistors within said plurality of resistors.

11. The semiconductor circuit of claim 10, wherein a gate of said at least another p-type field effect transistor is connected to said control input node.

12. The semiconductor circuit of claim 10, wherein a sequence of resistance for successive resistors in said plurality of resistors is the same as a sequence of resistance for successive resistors in said series connection of said at least two upper resistors.

13. The semiconductor circuit of claim 12, wherein a sequence of resistance for successive resistors in said series connection of said at least two lower resistors is a scalar multiple of said sequence of resistance for successive resistors in said series connection of said at least two upper resistors.

14. The semiconductor circuit of claim 13, wherein said sequence of resistance for successive resistors in said plurality of resistors begins with a resistor located most proximate to said bitline, wherein said sequence of resistance for successive resistors in said series connection of said at least two upper resistors begins with a resistor located most proximate to said reference voltage line among said series connection of said at least two upper resistors, and wherein said sequence of resistance for successive resistors in said series connection of said at least two lower resistors begins with a resistor located most proximate to said reference voltage line among said series connection of said at least two lower resistors.

15. The semiconductor circuit of claim 1, wherein said leakage current simulation circuit includes a series connection of a first electrically programmable fuse (e-fuse) and a first programming transistor, and wherein each of said second bitcells includes a series connection of a second e-fuse and a second programming transistor.

16. The semiconductor circuit of claim 15, wherein said first programming transistor and said second programming transistor have a same design and same leakage characteristics.

17. The semiconductor circuit of claim 15, wherein a leakage current between said reference voltage line and electrical ground through said leakage current simulation circuit generates a leakage current between 5% and 100% of a leakage current from one of said at least one bitline unit to electrical ground in the absence of any programming of any of said first bitcells.

18. The semiconductor circuit of claim 16, wherein said first e-fuse and said second e-fuse have a same design.

19. The semiconductor circuit of claim 16, wherein each of said at least one bitline unit includes a first number of first bitcells, wherein said reference voltage generator includes a second number of second bitcells, and wherein said second number is between 25% and 400% of said first number.

20. The semiconductor circuit of claim 1, wherein said at least one bitline unit is a plurality of bitline units, each having a same design.

* * * * *